United States Patent
Tao

(10) Patent No.: US 8,339,168 B2
(45) Date of Patent: Dec. 25, 2012

(54) PULSE-WIDTH MODULATION CIRCUIT, A DEVICE INCLUDING THE SAME AND A METHOD FOR PULSE-WIDTH MODULATION

(75) Inventor: Yunbin Tao, Shanghai (CN)

(73) Assignee: Beken Corporation, Shanghai (CN)

( * ) Notice: Subject to any disclaimer, the term of this patent is extended or adjusted under 35 U.S.C. 154(b) by 174 days.

(21) Appl. No.: 12/987,161

(22) Filed: Jan. 10, 2011

(65) Prior Publication Data

US 2012/0146696 A1 Jun. 14, 2012

(30) Foreign Application Priority Data

Dec. 8, 2010 (CN) .......................... 2010 1 0578587

(51) Int. Cl.
*H03K 3/017* (2006.01)
(52) U.S. Cl. ........................................ 327/172; 327/175
(58) Field of Classification Search .................... None
See application file for complete search history.

(56) References Cited

U.S. PATENT DOCUMENTS

| 5,379,321 | A * | 1/1995 | Girmay | 375/358 |
| 7,268,639 | B2 * | 9/2007 | Matsushita | 332/109 |
| 2008/0164925 | A1 * | 7/2008 | Cheon et al. | 327/172 |

* cited by examiner

*Primary Examiner* — Cassandra Cox
(74) *Attorney, Agent, or Firm* — Perkins Coie LLP; Aaron Wininger

(57) ABSTRACT

A PWM circuit comprises: a charge and discharge circuit to receive a initial signal and, according to the initial signal, increase a voltage at an output end of thereof linearly or decrease the voltage; a comparator with a positive input end to receive a control signal and a negative input end connected to the output end of the charge and discharge circuit; a voltage transmission circuit with a first input end to receive the initial signal and a second input end to receive an output of the comparator, the voltage transmission circuit is configured to transmit the initial signal to an output end of the voltage transmission circuit when the output of the comparator is digital 1, and output digital 0 when the output of the comparator is digital 0.

20 Claims, 9 Drawing Sheets

PULSE-WIDTH MODULATION CIRCUIT, A DEVICE INCLUDING THE SAME AND A METHOD FOR PULSE-WIDTH MODULATION

CLAIM OF PRIORITY

This application claims priority to Chinese Application number 201010578587.6 entitled "A PULSE-WIDTH MODULATION CIRCUIT, A DEVICE INCLUDING THE SAME AND A METHOD FOR PULSE-WIDTH MODULATION", filed on Dec. 8, 2010, which is incorporated herein by reference.

TECHNICAL FIELD

The present application relates to digital signal modulation, particularly to a pulse-width modulation (PWM) circuit, a device including the PWM circuit and a method for PWM.

BACKGROUND OF THE INVENTION

In a device including a PWM circuit, to ensure the device can work normally, a maximum duty cycle of a modulation signal output by the PWM circuit needs to be controlled (e.g., no more than 90%).

A gain defined by equation (1) is another important parameter for a PWM $$\text{Gain} = \frac{\text{Duty}}{V_{ctrl}} \quad (1)$$

Where Duty is a duty cycle of a modulation signal output by the PWM circuit, $V_{ctrl}$ is a voltage of a control signal provided to the PWM circuit.

Conventionally, a PWM circuit can have a controllable maximum duty cycle but not simultaneously a controllable gain. Controllable gain is needed to keep other components, e.g., a feedback loop, stable. Without stability, the feedback loop cannot generate desirable output signals.

Therefore, a PWM circuit with a controllable maximum duty cycle and gain is desirable.

BRIEF DESCRIPTION OF THE INVENTION

To this end, according to an embodiment of the invention, a pulse-width modulation circuit comprises:

a charge and discharge circuit configured to receive a initial signal and, according to the received initial signal, increase a voltage at an output end of the charge and discharge circuit linearly or decrease the voltage;

a comparator with a positive input end configured to receive a control signal and a negative input end connected to the output end of the charge and discharge circuit;

a voltage transmission circuit with a first input end configured to receive the initial signal and a second input end connected to an output end of the comparator and configured to receive an output of the comparator, the voltage transmission circuit is configured to transmit the initial signal to an output end of the voltage transmission circuit when the output of the comparator is digital 1, and output digital 0 when the output of the comparator is digital 0.

In addition, according to another embodiment of the invention, a method for pulse-width modulation comprises:

providing a pulse-width modulation circuit, comprising:

a charge and discharge circuit configured to receive a initial signal and, according to the received initial signal, increase a voltage at an output end of the charge and discharge circuit linearly or decrease the voltage;

a comparator with a positive input end configured to receive a control signal and a negative input end connected to the output end of the charge and discharge circuit;

a voltage transmission circuit with a first input end configured to receive the initial signal and a second input end connected to an output end of the comparator and configured to receive an output of the comparator, the voltage transmission circuit is configured to transmit the initial signal to an output end of the voltage transmission circuit when the output of the comparator is digital 1, and output digital 0 when the output of the comparator is digital 0; and using the provided pulse-width modulation circuit for pulse-width modulation.

In addition, according to another embodiment of the invention, a device comprises:

a pulse-width circuit, comprising:

a charge and discharge circuit configured to receive a initial signal and, according to the received initial signal, increase a voltage at an output end of the charge and discharge circuit linearly or decrease the voltage;

a comparator with a positive input end configured to receive a control signal and a negative input end connected to the output end of the charge and discharge circuit;

a voltage transmission circuit with a first input end configured to receive the initial signal and a second input end connected to an output end of the comparator and configured to receive an output of the comparator, the voltage transmission circuit is configured to transmit the initial signal to an output end of the voltage transmission circuit when the output of the comparator is digital 1, and output digital 0 when the output of the comparator is digital 0.

According to an embodiment of the invention, an upper limit is set for a duty cycle of a modulation signal output by a PWM circuit. Further more, there is a linear relationship between the duty cycle of the modulation signal and a voltage of a control signal hence the gain is constant and well restricted.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-know structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Note that many devices may incorporate a PWM circuit. Without loss of generality, a boost power converter, which is a kind of DC-DC power converter, will be taken as a primary example of the device hereinafter. Other embodiments of the device may include (Class D) audio amplifiers, etc.

Figure 1:
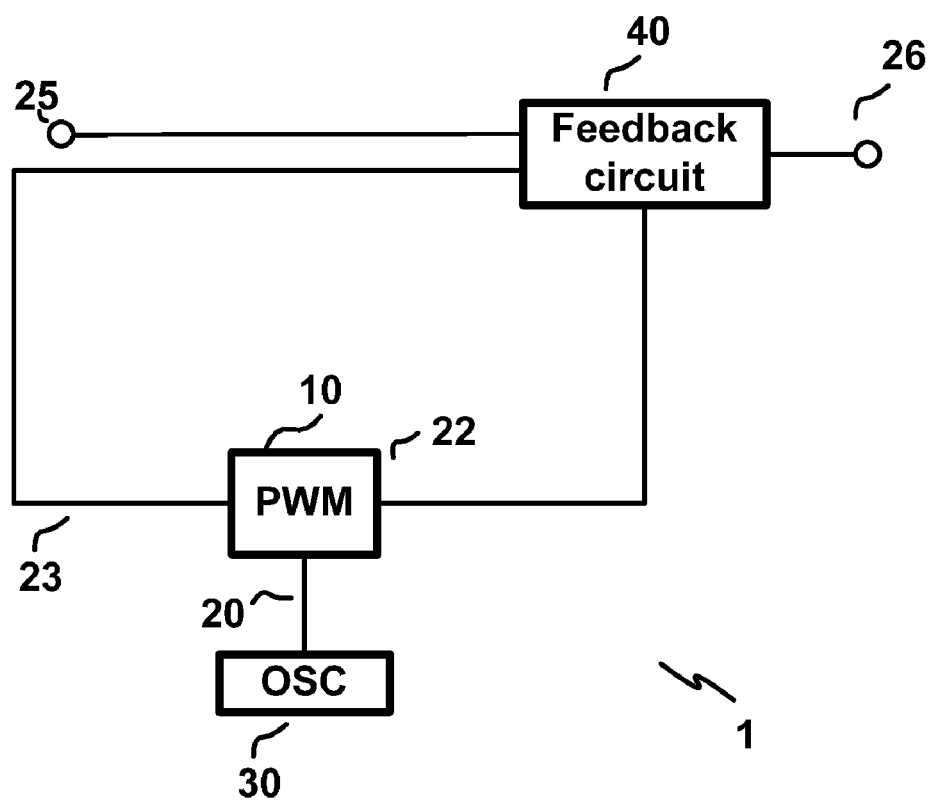
FIG. 1 is a block diagram illustrating a boost power converter according to an embodiment of the invention.
Figure 2:
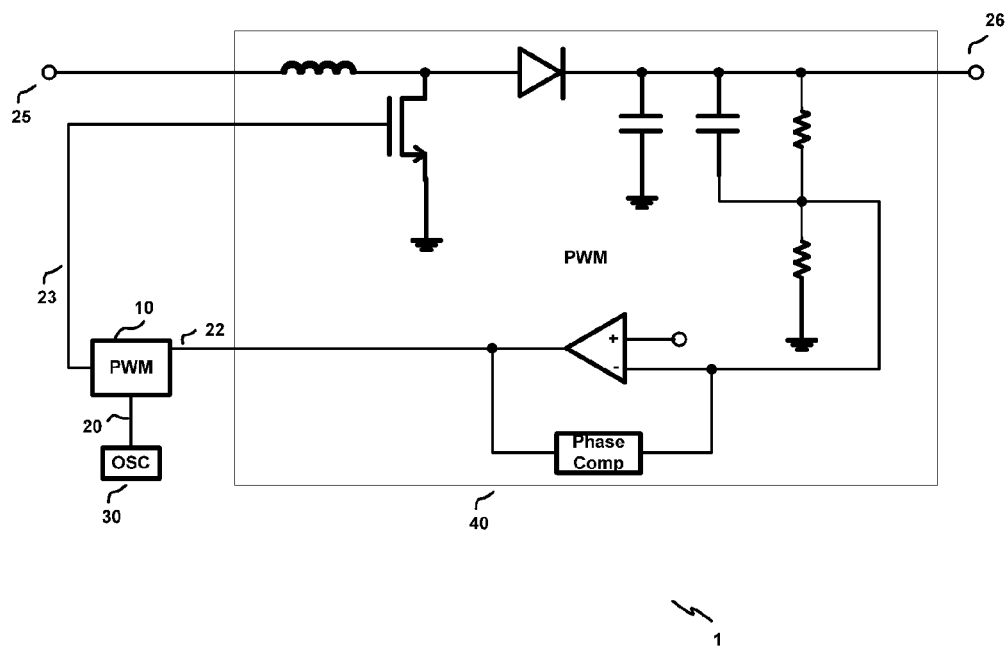
FIG. 2 is a circuit diagram illustrating a boost power converter according to an embodiment of the invention.

FIG. 1 is a circuit diagram illustrating a boost power converter according to an embodiment of the invention. FIG. 2 is a circuit diagram illustrating a boost power converter according to an embodiment of the invention.

In a boost power converter 1 shown in FIG. 1, A signal source such as an oscillator 30 is configured to generate a initial signal 20, such as a square wave signal with a certain duty cycle, e.g., 90% or less. A pulse-width modulation circuit (PWM circuit) 10 and a feedback circuit 40 receiving a to-be-converted signal 25 form a feedback loop. While the PWM circuit 10 is working under the action of a control signal 22 from the feedback circuit 40, the feedback circuit 40 uses both the to-be-converted signal 25 and a modulation signal 23 from the PWM circuit 10 to generated the control signal 22 and a converted signal 26. The converted signal 26 is also an output of the boost power converter 1.

Figure 3:
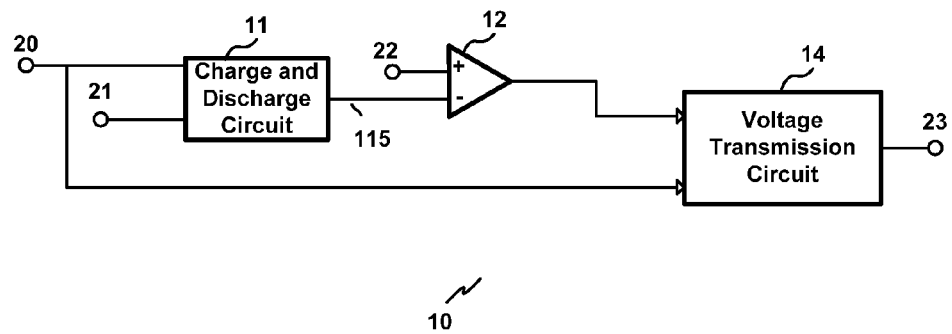
FIG. 3 is a block diagram illustrating a PWM circuit according to an embodiment of the invention.

A PWM circuit according to an embodiment of the invention will be described in detail with reference to FIG. 3. As can be seen in FIG. 3, a charge and discharge circuit 11 is configured to receive the initial signal 20 and a reference signal 21. The reference signal 21 has a reference voltage such as about 0.6V to about 0.7V. An exemplary source of the reference signal 21 may include a current source and an N-type MOSFET (NMOS). A source of the NMOS is grounded, a gate of the NMOS is connected with a drain of the NMOS and a negative terminal of the current source. A positive terminal of the current source is connected to a positive working voltage source and provided with a positive working voltage, such as Vdd. In different embodiments of the invention, the source of the reference signal can be separated from the charge and discharge circuit 11, from the PWM circuit 10, or integrated on the charge and discharge circuit 11.

The PWM circuit 10 in FIG. 3 further includes a comparator 12 with a positive input end to receive the control signal 22 and a negative input end connected to an output end 115 of the charge and discharge circuit 11. The control signal 22 is introduced for pulse-width modulation. The comparator 12 outputs digital 1 when a voltage of the control signal 22 is higher than a voltage at the output end 115, otherwise outputs digital 0.

A voltage transmission circuit 14 receives the output from the comparator 12 via a first input end and receives the initial signal 20 via a second input end. Under the control of the output of the comparator 12, the voltage transmission circuit 14 transmits the initial signal 20 to an output end 23 of the voltage transmission circuit 14 or output digital 0. It can be seen that the duty cycle of the output signal 23 will not be larger than the duty cycle of the initial signal 20. Therefore, the maximum duty cycle of the output signal 23 can be set by engineering the duty cycle of the initial signal 20.

The PWM circuit 10 shown in FIG. 3 will be described in detail with reference to FIG. 4.

Specifically, the charge and discharge circuit 11 includes an inverter 110, a first switch 111 (switch 111), a capacitor 112, a second switch 113 (switch 113) and a first current source 114 (current source 114). The inverter 110 receives the initial signal 20 and generates an inverted signal.

Figure 4:
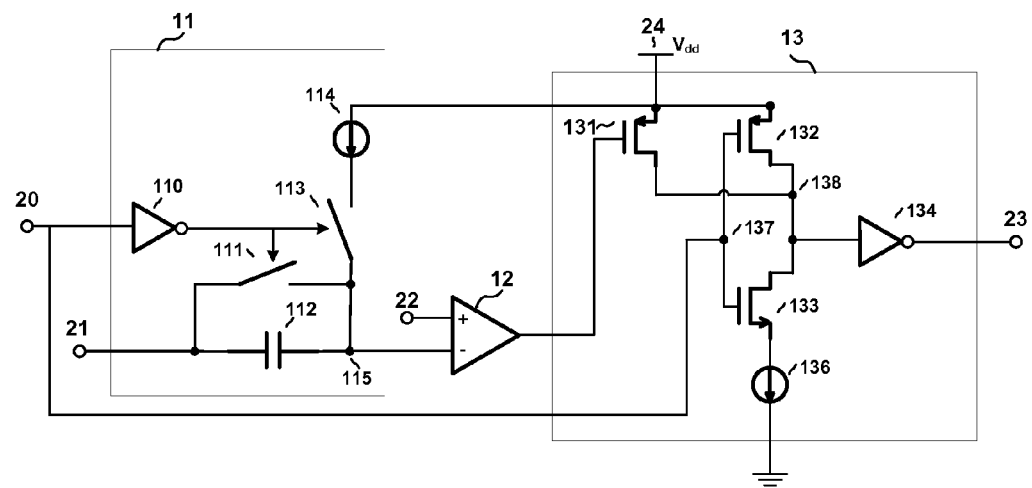
FIG. 4 is a circuit diagram illustrating a PWM circuit according to an embodiment of the invention.

In the embodiment shown in FIG. 4, each of the switches 111 and 114 includes a three-end switch. Each switch receives the inverted signal as a command and becomes open or closed between the other two ends so as to take effect on the PWM circuit 11. Specifically, when the inverted signal is digital 0, the first switch 113 is closed so that the current source 114 charges the capacitor 112 at a second terminal 115 of the capacitor 112, a voltage at the second terminal 115 increases linearly accordingly. When the inverted signal is digital 1, the switch 113 is open, the switch 111 is closed. Therefore, the capacitor 112 discharges through the switch 111, the voltage 115 decreases sharply to a reference voltage 21.

Figure 5:
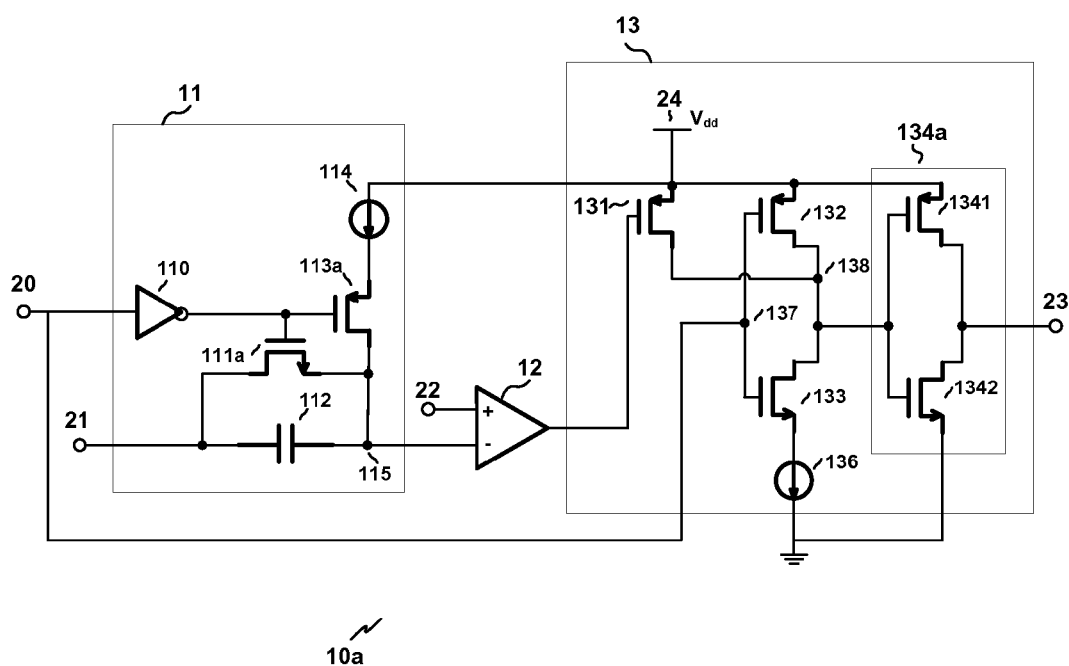
FIG. 5 is a detailed view of the PWM circuit in FIG. 4.

Switches 111 and 113 have different embodiments, one of which is shown in a PWM circuit 10a in FIG. 5. Wherein, in a charge and discharge circuit 11a, the switch 111 is formed by a first N-type MOSFET 111a (MOS 111a), the switch 113 is formed by a first P-type MOSFET 113a (MOS 113a). A gate of the MOS 111a and a gate of the MOS 113a respectively receive the inverted signal. A drain of the MOS 111a and a first terminal (on the left in FIGS. 4 and 5) of the capacitor 112 are connected with each other and provided with a reference voltage 21. A positive terminal of the current source 114 is provided with a positive working voltage, such as Vdd 24. A negative terminal of the current source 114 is connected with a drain of the MOS 113a. A source of the MOS 111a is connected with a drain of the MOS 113a and a second terminal (on the right in FIGS. 4 and 5) of the capacitor 112 to form an output end 115 of the charge and discharge circuit 11.

The PWM circuit 10 in FIG. 4 includes a voltage transmission circuit 13 with a second P-type MOSFET 131 (MOS 131), a third P-type MOSFET 132 (MOS 132), a second N-type MOSFET 133, a second inverter 134 (inverter 134) and a second current source 136 (current source 136).

A gate of the MOS 131 is connected to the output end of the comparator 12. Respective sources of the MOSs 131 and 132 are provided with Vdd 24. A drain of the MOS 131 is connected with a drain of the MOS 132, a drain of the MOS 133, an input end of the inverter 134. A source of the MOS 133 is connected to a positive terminal of the current source 136. A negative terminal of the current source 136 is grounded. An output end of the inverter 134 is configured as the output end of the voltage transmission circuit 13, i.e., the output end of the PWM circuit 10.

The inverter 134 will output digital 1 when its input is digital 0, otherwise the inverter 134 will output digital 0. To this end, the inverter 134 has different embodiments, one of which is shown in the PWM circuit 10a in FIG. 5. The inverter 134a includes a fourth P-type MOSFET 1341 (MOS 1341) and a third N-type MOSFET 1342 (MOS 1342). A gate of the MOS 1341 is connected with a gate of the MOS 1342 to form the input end of the inverter 134a, a drain of the MOS 1341 is connected with a drain of the MOS 1342 to form the output end of the inverter 134a, a source of the MOS 1342 is grounded.

Reference will be made to the PWM circuit 10 in FIG. 5 through a few examples below. Without loss of generality, a initial signal 20 has a duty cycle of 90%.

Figure 6:
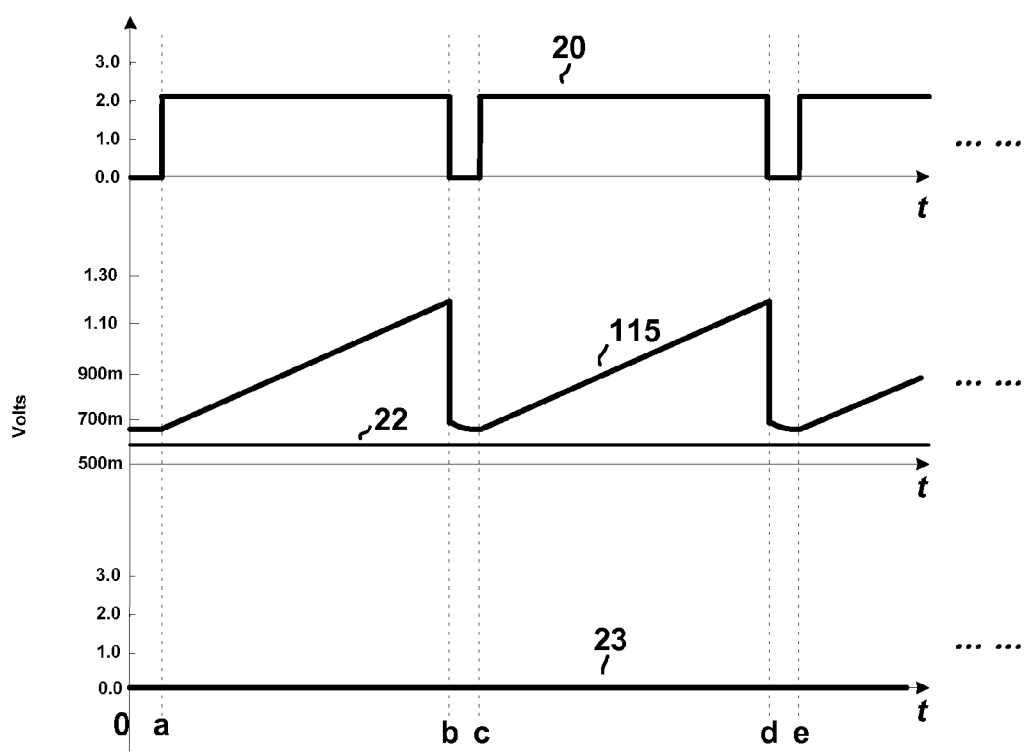
FIG. 6 is a drawing illustrating wave forms of signal in the PWM circuit in FIG. 4 according to an example of the invention.

Example 1: the voltage of the control signal 22 is lower than the reference voltage, i.e., $V_{ctrl} < V_{ref}$ Wave forms of signals in FIG. 5 according to this example are illustrated in FIG. 6. At t=0, signal 20 is digital 0, the inverted signal is 1. Accordingly MOS 111a is closed and hence a return circuit is formed for the capacitor 112 to discharge. As a result, the two first and second terminals of the capacitor 112 share the same voltage, i.e., the reference voltage.

At t=a, signal 20 turns from 0 to 1, the inverted signal is 0. Accordingly, MOS 111 is open and MOS 113a is closed. The current source 114 charges the capacitor 112 at the second terminal 115 via the closed MOS 113a. Therefore, the voltage at the output end 115 increases linearly from the reference voltage, as shown in FIG. 6.

At t=b, when signal 20 turns back to 0, the capacitor 112 discharges sharply through the closed MOS 111a such that the voltage at the output end 115 decreases and then the two terminals of the capacitor 112 share the same voltage again.

As the voltage of the control signal 22 is lower than the reference voltage, and the voltage at the output end 115 of the charge and discharge circuit 11 is not lower than the reference voltage 21, the voltage at the positive input end of the comparator 12 is always lower than the voltage at its negative input end. Therefore, the output of the comparator 12 is constant 0.

Consequently, in this example, the MOS 131 is always closed.

In case the signal 20 is 0, the MOS 132 is closed and enters a saturated area at first. However, the MOS 133 is still open, which then forces the MOS 132 from the saturated area into a linear area immediately. A voltage between the source and drain of the MOS 132 is then approximately 0. The MOS 132 now can be considered as a good electrical conductor extending between the source and the drain. Thus, a voltage at point 138, i.e., the voltage at the drain of the MOS 132, is digital 1, which opens the MOS 1342. Again, the MOS 1342 will be forced into a linear area by the MOS 1341. Similarly, the MOS 1342 now can be considered as a good electrical conductor extending between its drain and source, a voltage at the drain of the MOS 1342, i.e., the voltage at the output end 23 will be the potential of the ground, i.e., digital 0.

When the signal 20 is 1, i.e., from t=a to t=b, from t=c to t=d, etc, the MOS 133 is closed. The voltage at point 138 is determined by the MOS 131 and the current source 136. Since the current source 136 is providing a weak current, e.g., about 2 μA, the voltage of Vdd 24 (i.e., digital 1) will be transmitted or reflected at point 138. Therefore, the output signal 23 will be digital 0.

See FIG. 6, when the voltage of the control signal 22 is lower than the reference signal 21, the output signal 23 will be constant 0, which means the duty cycle of the output signal 23 is also 0. Applying duty cycle (Duty)=0 to equation (1), the gain of the PWM circuit in this example is 0.

Figure 7:
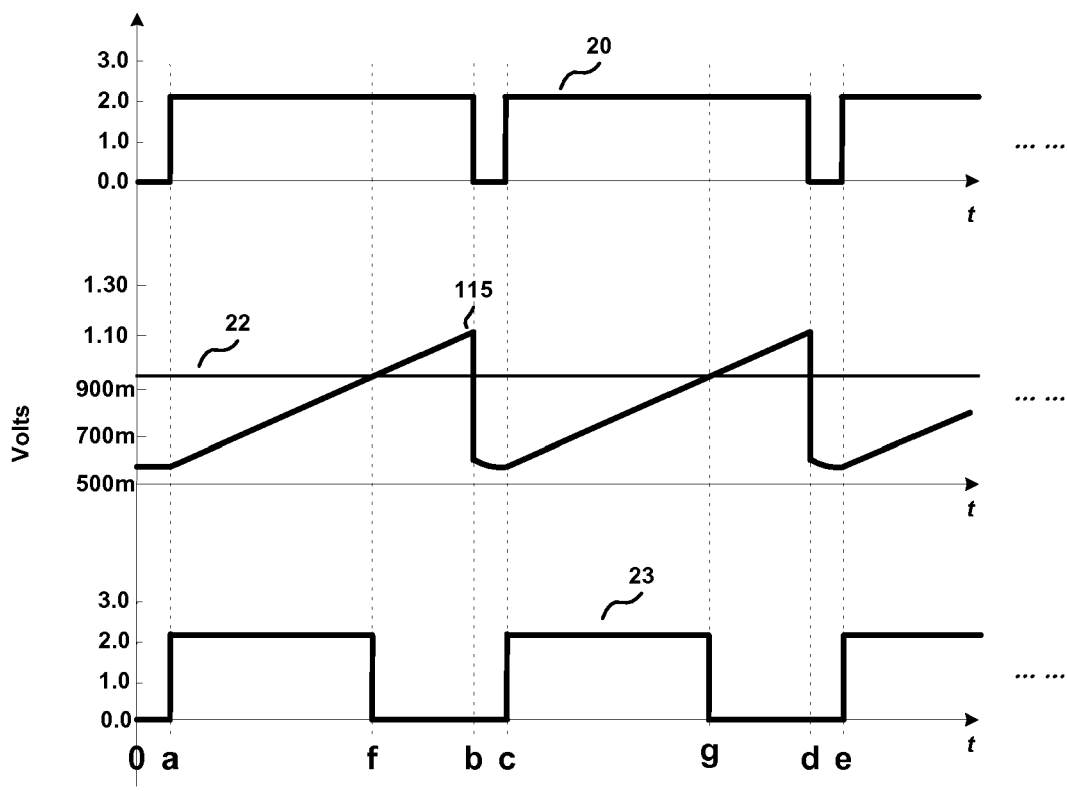
FIG. 7 is a drawing illustrating wave forms of signal in the PWM circuit in FIG. 4 according to an example of the invention.

Example 2: the voltage of the control signal 22 is higher or equal to the reference voltage, but is lower than the voltage at the output end 115 of the charge and discharge circuit 11 at the end of charging, i.e., $V_{ref} \leq V_{ctrl} < V_{chg\_final}$ Wave forms of signals in FIG. 5 according to this example are illustrated in FIG. 7. In practice of a PWM circuit, e.g., the PWM circuit 10a in FIG. 5, a relationship between the voltage at point 115 and the voltage of the control signal 22 is shown in FIG. 7.

As mentioned in part above, when the signal 20 is 0, e.g., from t=a to t=b in FIG. 6, the voltage at point 138 will be 1 and hence the output signal 23 will be 0, no matter if the output of the comparator is 0 or 1. Therefore, this disclosure will primarily focus on the operation of the PWM circuit 10 when the signal 20 is 1 hereinafter.

In FIG. 7, at t=a, signal 20 turns to 1. The capacitor 112 starts to charge at point 115. As shown in FIG. 7, the voltage at point 115 increases from the reference voltage and gets to the voltage of the control signal 22. Thus, the output of the comparator 12 turns from 1 to 0. The MOS 131 is hence closed. The MOS 133 is also closed by the signal 20. Under the action of the current source 136, the MOS 131 is more conductive than the MOS 133. Therefore, as mentioned above, the voltage at point 138 will be digital 1 and hence the output signal 23 will be digital 0.

In the duration when the voltage at point 115 is higher than the voltage of the control signal 22, as can be seen in FIG. 7, the output signal 23 will be 0. Then a falling edge of the signal 20 arrives. The capacitor 112 discharges so as the voltage at point 115 decreases to the reference voltage again. Since signal 20 is 0, the output signal 23 is 0. A period ends at t=c.

The duty cycle of the output signal 23 in example 2, as shown in FIG. 7 can be illustrated by equation (2):

$$\text{Duty} = \frac{C*(V_{ctrl} - V_{ref})}{I_{chg}*T} \quad (2)$$

Where C is the capacitance of the capacitor 112, $I_{chg}$ is the current provided by the current source 114, T is the period of the signal 20 (also the period of the output signal 23). From FIG. 7 and equation (2), it can be seen that the duty cycle of the output signal 23 is lower than the duty cycle of the signal 20.

From equation (2), it can be seen that the relationship between the duty cycle and the voltage of the control signal 22 is linear. Example 3: the voltage of the control signal 22 is higher than the voltage at the output end 115 of the charge and discharge circuit 11 at the end of charging, i.e., $V_{ctrl} / V_{chg\_final}$ Referring to FIG. 8, the voltage at the output end of the charge and discharge circuit 11 will not exceed the voltage of the control signal 22. Therefore, the output of the comparator 12 is always 1 and the MOS 131 is kept open.

Therefore, the voltage at point 138 is determined by: at least one of the signal 20, the MOS 132, the MOS 133 and the current source 136.

In case that the signal 20 is 0, the voltage at point 138 is 1, the output signal is 0 accordingly.

In case that the signal 20 is 1, the MOS 133 is closed when the MOS 132 is open. The MOS 133 can be considered as a conduct extending between its drain and source. The voltage at point 138 is hence the potential of the ground, i.e., digital 0. Thus, the output signal 23 is digital 1.

Figure 8:
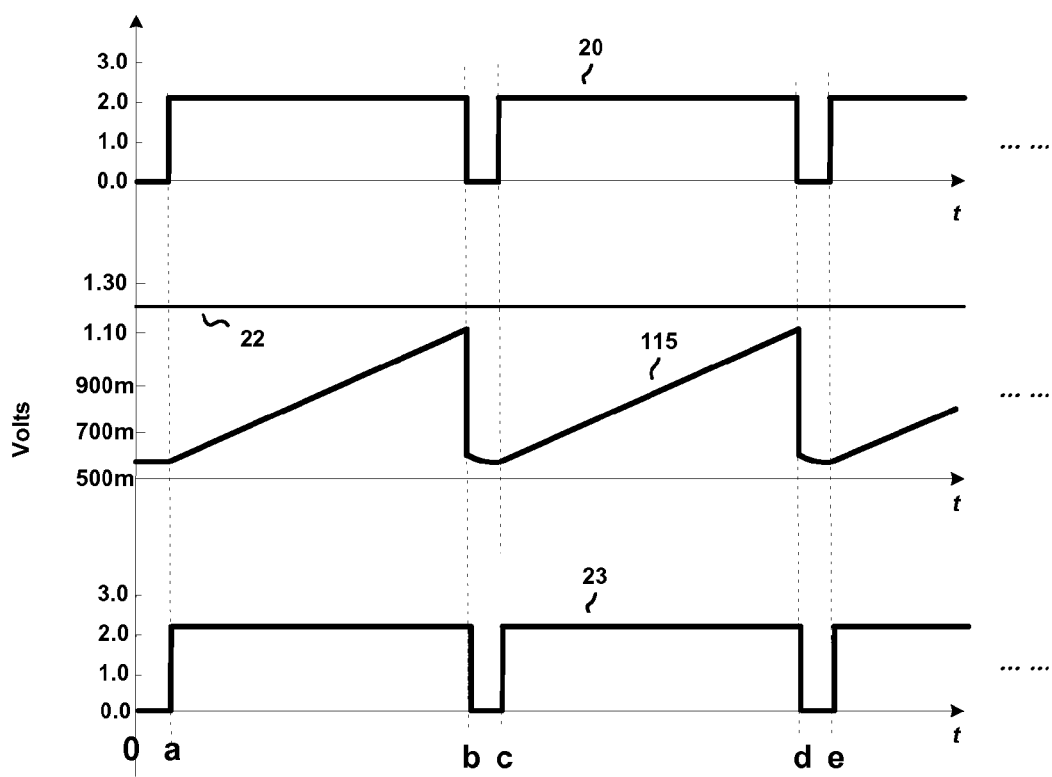
FIG. 8 is a drawing illustrating wave forms of signal in the PWM circuit in FIG. 4 according to an example of the invention.

From the description with respect to example 3 and FIG. 8, it can be seen that the duty cycle of the output signal 23 will be equal to the duty cycle of the signal 20.

The output signal 23 achieves a highest duty cycle in example 3 compared with examples 1 and 2, i.e., 90%, which is, however, still acceptable. Further, if 90% is undesirably high in practice, one can control the duty cycle of the output signal 23 by replacing the signal 20 with another lower-duty signal.

Applying duty cycle=90% to equation (1), the gain can be calculated, which is a constant according to example 3.

Figure 9:
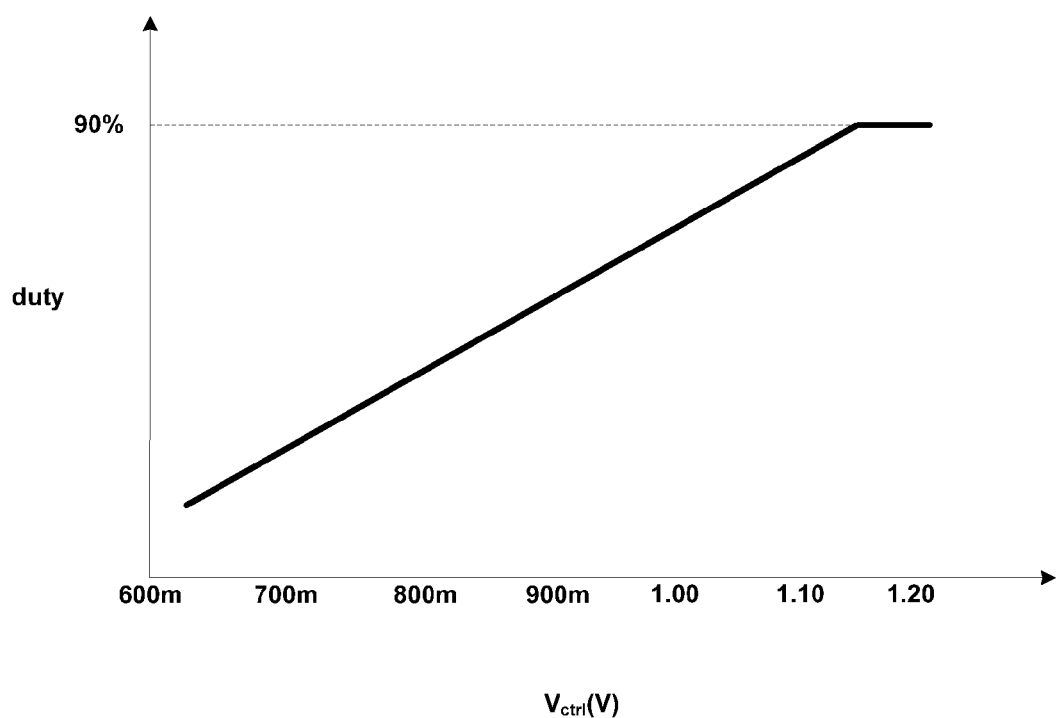
FIG. 9 is a drawing illustrating a relationship between a duty cycle of a PWM signal and a voltage of a control signal according to an embodiment of the invention.

FIG. 9 is a drawing illustrating the relationship between a duty cycle of the output signal 23 and the voltage of the control signal 22 according to an embodiment of the invention. The drawing is covering the aforesaid examples 2 and 3. For example 1, the duty cycle is always 0 and omitted in FIG. 9.

From FIG. 9, it can be seen that according to an embodiment of the invention, there is a linear relationship between the duty cycle of the output signal 23 and the voltage of the control signal 22.

Figure 10:
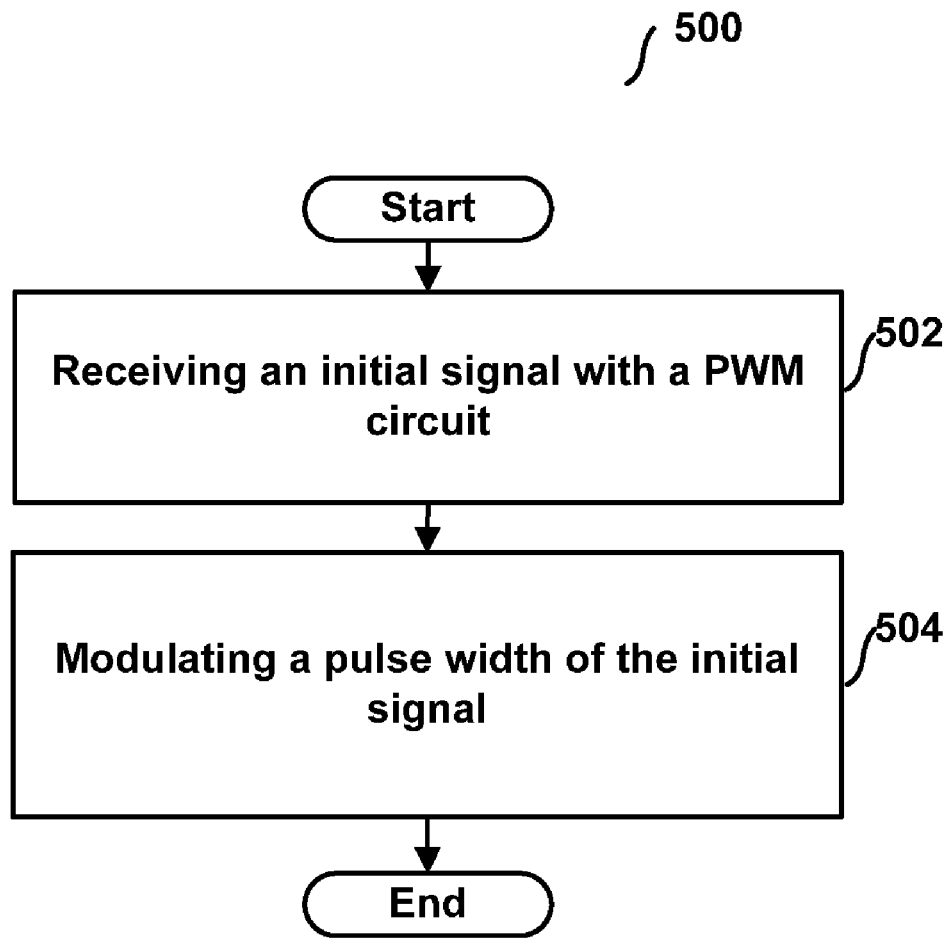
FIG. 10 is a flow chart of a method according to an embodiment of the invention.

FIG. 10 is a flow chart of a method 500 for PWM according to an embodiment of the invention. In an embodiment of the invention, in step 502, the PWM circuit 10 or 10a receives a initial signal as discussed above. In step 504, the PWM circuit 10 or 10a modulates a pulse width of the initial signal.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A pulse-width modulation circuit, comprising:
    a charge and discharge circuit configured to receive a initial signal and, according to the received initial signal, increase a voltage at an output end of the charge and discharge circuit linearly or decrease the voltage;
    a comparator with a positive input end configured to receive a control signal and a negative input end connected to the output end of the charge and discharge circuit;
    a voltage transmission circuit with a first input end configured to receive the initial signal and a second input end connected to an output end of the comparator and configured to receive an output of the comparator, the voltage transmission circuit is configured to transmit the initial signal to an output end of the voltage transmission circuit when the output of the comparator is digital 1, and output digital 0 when the output of the comparator is digital 0.

2. The pulse-width modulation circuit according to claim 1, wherein the charge and discharge circuit is further configured to increase the voltage at the output end of the charge and discharge circuit from a reference voltage linearly when the initial signal is digital 1, and decrease the voltage to the reference voltage when the initial signal is digital 0.

3. The pulse-width modulation circuit according to claim 2, wherein the charge and discharge circuit comprises:
    a first inverter, a capacitor, a first switch, a second switch and a first current source,
        wherein the inverter is configured to receive the initial signal and generate an inverted signal to control the first and second switches, a first terminal of the capacitor is configured to receive the reference voltage, a second terminal of the capacitor is configured as the output end of the charge and discharge circuit,
        when the inverted signal is digital 0, the first switch is closed and the second switch is open, the first current source charges the capacitor at the second terminal through the first switch so as to increase the voltage at the output end of the charge and discharge circuit,
        when the inverted signal is digital 1, the first switch is open and the second switch is closed, the capacitor discharges through the second switch so as to decrease the voltage at the output end of the charge and discharge circuit.

4. A pulse-width modulation circuit according to claim 3, wherein the first switch includes a first P-type MOSFET, the second switch includes a first N-type MOSFET, a gate of the first N-type MOSFET and a gate of the first P-type MOSFET is configured to receive the inverted signal, the first terminal of the capacitor is connected to a drain of the first N-type MOSFET, the second terminal of the capacitor is connected with a source of the first N-type MOSFET and a drain of the first P-type MOSFET, a positive terminal of the first current source is provided with a positive working voltage, a negative terminal of the first current source is connected with a source of the first P-type MOSFET.

5. The pulse-width modulation circuit according to claim 1, wherein the voltage transmission circuit comprises:
    a second P-type MOSFET, a third P-type MOSFET, a second N-type MOSFET, a second inverter and a second current source,
    wherein a source of each of the second, third P-type MOSFETs is provided with the positive working voltage, a gate of the third P-type MOSFET is connected with a gate of the second N-type MOSFET to form the first input end of the voltage transmission circuit, a gate of the second P-type MOSFET is configured as the second input end of the voltage transmission circuit, a drain of the second P-type MOSFET is connected with a drain of the third P-type MOSFET, a drain of the second N-type MOSFET and an input end of the second inverter, an output end of the second inverter is configured as the output end of the voltage transmission circuit, a source of the second N-type MOSFET is connected to a positive terminal of the second current source, a negative terminal of the second current source is grounded.

6. The pulse-width modulation circuit according to claim 5, wherein the second inverter includes a fourth P-type MOSFET and a third N-type MOSFET, a gate of the fourth P-type MOSFET is connected with a gate of the third N-type MOSFET to form the input end of the second inverter, a drain of the fourth P-type MOSFET is connected with a drain of the third N-type MOSFET to form the output end of the second inverter, a source of the third N-type MOSFET is grounded.

7. A method for pulse-width modulation, comprising:
    receiving a initial signal with a pulse-width modulation circuit, the pulse-width modulation circuit comprises:
        a charge and discharge circuit configured to receive the initial signal and, according to the received initial signal, increase a voltage at an output end of the charge and discharge circuit linearly or decrease the voltage;
        a comparator with a positive input end configured to receive a control signal and a negative input end connected to the output end of the charge and discharge circuit;
        a voltage transmission circuit with a first input end configured to receive the initial signal and a second input end connected to an output end of the comparator and configured to receive an output of the comparator, the voltage transmission circuit is configured to transmit the initial signal to an output end of the voltage transmission circuit when the output of the comparator is digital 1, and output digital 0 when the output of the comparator is digital 0; and modulating the initial signal with the pulse-width modulation circuit.

8. The method according to claim 7, wherein the charge and discharge circuit is further configured to increase the voltage at the output end of the charge and discharge circuit from a reference voltage linearly when the initial signal is digital 1, and decrease the voltage to the reference voltage when the initial signal is digital 0.

9. The method according to claim 8, wherein the charge and discharge circuit comprises:

an first inverter, a capacitor, a first switch, a second switch and a first current source,
  wherein the inverter is configured to receive the initial signal and generate an inverted signal to control the first and second switches, a first terminal of the capacitor is configured to receive the reference voltage, a second terminal of the capacitor is configured as the output end of the charge and discharge circuit,
  when the inverted signal is digital 0, the first switch is closed and the second switch is open, the first current source charges the capacitor at the second terminal through the first switch so as to increase the voltage at the output end of the charge and discharge circuit,
  when the inverted signal is digital 1, the first switch is open and the second switch is closed, the capacitor discharges through the second switch so as to decrease the voltage at the output end of the charge and discharge circuit.

10. The method according to claim 9, wherein the first switch includes a first P-type MOSFET, the second switch includes a first N-type MOSFET, a gate of the first N-type MOSFET and a gate of the first P-type MOSFET is configured to receive the inverted signal, the first terminal of the capacitor is connected to a drain of the first N-type MOSFET, the second terminal of the capacitor is connected with a source of the first N-type MOSFET and a drain of the first P-type MOSFET, a positive terminal of the first current source is provided with a positive working voltage, a negative terminal of the first current source is connected with a source of the first P-type MOSFET.

11. The method according to claim 7, wherein the voltage transmission circuit comprises:

a second P-type MOSFET, a third P-type MOSFET, a second N-type MOSFET, a second inverter and a second current source,
  wherein a source of each of the second, third P-type MOSFETs is provided with the positive working voltage, a gate of the third P-type MOSFET is connected with a gate of the second N-type MOSFET to form the first input end of the voltage transmission circuit, a gate of the second P-type MOSFET is configured as the second input end of the voltage transmission circuit, a drain of the second P-type MOSFET is connected with a drain of the third P-type MOSFET, a drain of the second N-type MOSFET and an input end of the second inverter, an output end of the second inverter is configured as the output end of the voltage transmission circuit, a source of the second N-type MOSFET is connected to a positive terminal of the second current source, a negative terminal of the second current source is grounded.

12. The method according to claim 11, wherein the second inverter includes a fourth P-type MOSFET and a third N-type MOSFET, a gate of the fourth P-type MOSFET is connected with a gate of the third N-type MOSFET to form the input end of the second inverter, a drain of the fourth P-type MOSFET is connected with a drain of the third N-type MOSFET to form the output end of the second inverter, a source of the third N-type MOSFET is grounded.

13. A device, comprising:

a pulse-width modulation circuit, comprising
  a charge and discharge circuit configured to receive a initial signal and, according to the received initial signal, increase a voltage at an output end of the charge and discharge circuit linearly or decrease the voltage;
  a comparator with a positive input end configured to receive a control signal and a negative input end connected to the output end of the charge and discharge circuit;
  a voltage transmission circuit with a first input end configured to receive the initial signal and a second input end connected to an output end of the comparator and configured to receive an output of the comparator, the voltage transmission circuit is configured to transmit the initial signal to an output end of the voltage transmission circuit when the output of the comparator is digital 1, and output digital 0 when the output of the comparator is digital 0.

14. The device according to claim 13, wherein the charge and discharge circuit is further configured to increase the voltage at the output end of the charge and discharge circuit from a reference voltage linearly when the initial signal is digital 1, and decrease the voltage to the reference voltage when the initial signal is digital 0.

15. The device according to claim 14, wherein the charge and discharge circuit comprises:

an first inverter, a capacitor, a first switch, a second switch and a first current source,
  wherein the inverter is configured to receive the initial signal and generate an inverted signal to control the first and second switches, a first terminal of the capacitor is configured to receive the reference voltage, a second terminal of the capacitor is configured as the output end of the charge and discharge circuit,
  when the inverted signal is digital 0, the first switch is closed and the second switch is open, the first current source charges the capacitor at the second terminal through the first switch so as to increase the voltage at the output end of the charge and discharge circuit,
  when the inverted signal is digital 1, the first switch is open and the second switch is closed, the capacitor discharges through the second switch so as to decrease the voltage at the output end of the charge and discharge circuit.

16. The device according to claim 15, wherein the first switch includes a first P-type MOSFET, the second switch includes a first N-type MOSFET, a gate of the first N-type MOSFET and a gate of the first P-type MOSFET is configured to receive the inverted signal, the first terminal of the capacitor is connected to a drain of the first N-type MOSFET, the second terminal of the capacitor is connected with a source of the first N-type MOSFET and a drain of the first P-type MOSFET, a positive terminal of the first current source is provided with a positive working voltage, a negative terminal of the first current source is connected with a source of the first P-type MOSFET.

17. The device according to claim 13, wherein the voltage transmission circuit comprises:
a second P-type MOSFET, a third P-type MOSFET, a second N-type MOSFET, a second inverter and a second current source,
wherein a source of each of the second, third P-type MOSFETs is provided with the positive working voltage, a gate of the third P-type MOSFET is connected with a gate of the second N-type MOSFET to form the first input end of the voltage transmission circuit, a gate of the second P-type MOSFET is configured as the second input end of the voltage transmission circuit, a drain of the second P-type MOSFET is connected with a drain of the third P-type MOSFET, a drain of the second N-type MOSFET and an input end of the second inverter, an output end of the second inverter is configured as the output end of the voltage transmission circuit, a source of the second N-type MOSFET is connected to a positive terminal of the second current source, a negative terminal of the second current source is grounded.

18. The device according to claim 17, wherein the second inverter includes a fourth P-type MOSFET and a third N-type MOSFET, a gate of the fourth P-type MOSFET is connected with a gate of the third N-type MOSFET to form the input end of the second inverter, a drain of the fourth P-type MOSFET is connected with a drain of the third N-type MOSFET to form the output end of the second inverter, a source of the third N-type MOSFET is grounded.

19. The device according to claim 13, wherein the device includes at least one of the following:
a DC-DC power converter;
an audio power amplifier.

20. The device according to claim 19, wherein the device includes a boost power converter, and further comprises:
a signal source configured to generated a initial signal;
a feedback circuit configured to receive a to-be-converted signal and the modulation signal, use the to-be-converted signal and the modulation signal to generate a control signal and a converted signal, and then provide the generated control signal to the pulse-width modulation circuit and output the converted signal as an output of the boost converter.

* * * * *